United States Patent
Liu

[19]

[11] Patent Number: 5,859,468

[45] Date of Patent: Jan. 12, 1999

[54] MICRO SEMICONDUCTOR BRIDGE RECTIFIER AND METHOD OF MANUFACTURING THE SAME

[75] Inventor: Tien-Ming Liu, Taoyuan, Taiwan

[73] Assignee: Pan Jit International Inc., Kaohsiung Hsien, Taiwan

[21] Appl. No.: 885,705

[22] Filed: Jun. 30, 1997

[30] Foreign Application Priority Data

Apr. 3, 1997 [CN] China ................................. 86104270

[51] Int. Cl.⁶ ................................................ H01L 29/00
[52] U.S. Cl. .............................................................. 257/544
[58] Field of Search .................................. 363/125, 126; 257/544, 549, 550, 653

[56] References Cited

U.S. PATENT DOCUMENTS

| | | | |
|---|---|---|---|
| 4,027,325 | 5/1977 | Genesi | 257/547 |
| 4,278,985 | 7/1981 | Stobbs | 257/477 |
| 4,281,448 | 8/1981 | Barry et al. | 257/549 |

FOREIGN PATENT DOCUMENTS 77212275  12/1988  China .

*Primary Examiner*—Matthew V. Nguyen
*Attorney, Agent, or Firm*—Merchant, Gould, Smith, Edell, Welter & Schmidt

[57] ABSTRACT

A micro semiconductor bridge rectifier comprises a first and a second diode chips. The first diode chip comprises an N-type substrate on which two P-type regions are formed. The second diode chip comprises a P-type substrate on which two N-type regions are formed. One P-type region of the first diode chip and one N-type region of the second diode chip are connected to one electrode of a first lead frame, the other P-type region of the first diode chip and the other N-type region of the second diode chip are connected to the other electrode of the first lead frame. The N-type substrate of the first diode chip and the P-type substrate of the second diode chip are connected to respective electrodes of a second lead frame. The method for manufacturing the micro semiconductor bridge rectifier comprises the steps of (a) forming the first diode chip, (b) forming the second diode chip, (c) connecting one P-type region of the first diode chip and one N-type region of the second diode chip to one electrode of the first lead frame, and connecting the other P-type region of the first diode chip and the other N-type region of the second diode chip to the other electrode of the first lead frame, and (d) connecting the N-type region of the first diode chip and the P-type region of the second diode chip to electrodes of the second lead frame respectively.

6 Claims, 3 Drawing Sheets

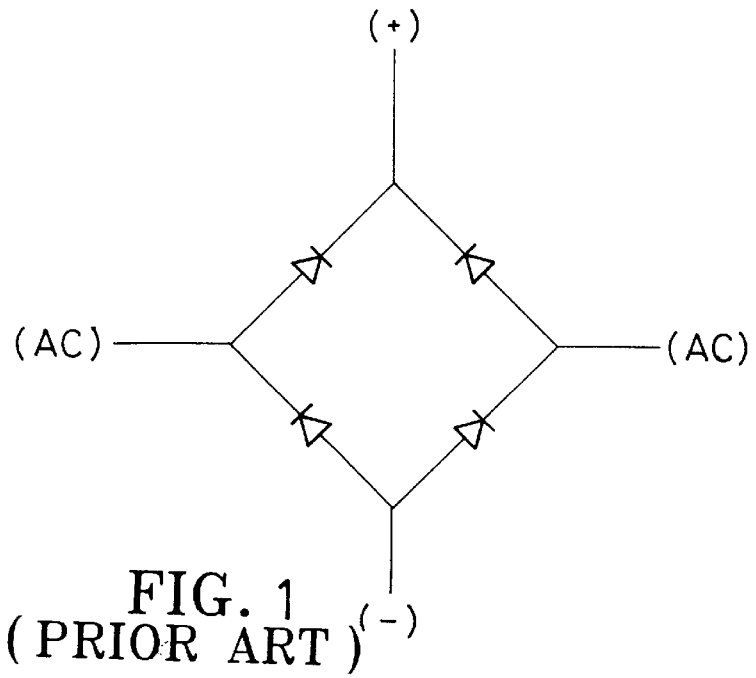
FIG. 1
(PRIOR ART)
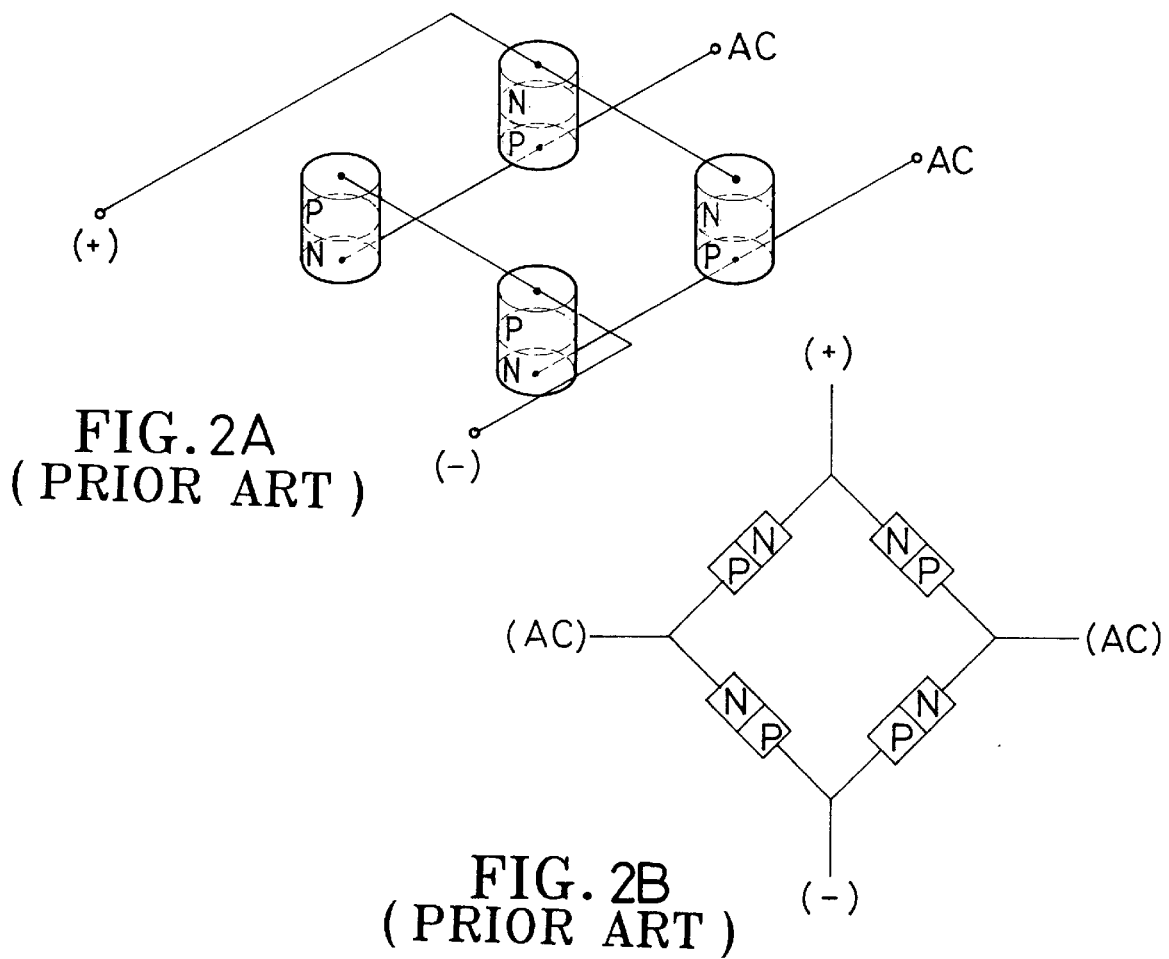
FIG. 2A
(PRIOR ART)
FIG. 2B
(PRIOR ART)

5,859,468

MICRO SEMICONDUCTOR BRIDGE RECTIFIER AND METHOD OF MANUFACTURING THE SAME

BACKGROUND OF THE INVENTION

The invention relates to bridge rectifiers, and in particular to a micro semiconductor bridge rectifier and the method of making the same.

Bridge rectifier is an electronic component well known in the art, which converts an input AC current into a DC current as an output. The structure of a known bridge rectifier is shown in FIG. 1, in which four rectifying diodes are connected in a specific arrangement to provide full-wave rectification.

ROC Patent Application No. 77212275, entitled "Improved Bridge Rectifier", discloses a bridge rectifier manufactured by semiconductor techniques. This prior art is incorporated herein by reference. In the prior art, four silicon diode chips connected with four electrodes are packaged to form a semiconductor bridge rectifier. FIGS. 2A and 2B respectively show the structure and schematic circuit arrangement of the prior art rectifier. The P-N junctions in the silicon diode chips limit the current to flow in one direction so as to provide the function of rectification.

In view of the fact that electronic products become more and more compact and surface mount technology has been employed during package process, it is a natural trend to downsize components. The method of manufacturing the known semiconductor bridge rectifier, however, requires connecting the four silicon diodes to electrodes and then packaging the diodes. Therefore, the size of the rectifier is not reduced and thus the requirement of downsizing cannot be met. Besides, the method is complicated and results in a poor yield rate.

SUMMARY OF THE INVENTION

An object of the invention is to provide a novel bridge rectifier with simple circuit arrangement and reduced size.

Another object of the invention is to provide a method for manufacturing the bridge rectifier. With the method, the processes can be simplified and the yield rate can be improved, and the bridge rectifier thus made has higher stability.

These and other objects, advantages and features of the present invention will be more fully understood and appreciated by reference to the written specification.

BRIEF DESCRIPTION OF THE DRAWINGS

FIG. 1 is a diagram showing the circuit arrangement of a conventional diode bridge rectifier;

FIG. 2A is a schematic diagram showing the structure of a conventional bridge rectifier comprising four diode chips;

FIG. 2B is a schematic diagram showing the circuit arrangement of the bridge rectifier shown in FIG. 2A;

DETAILED DESCRIPTION OF THE INVENTION

Figure 3A:
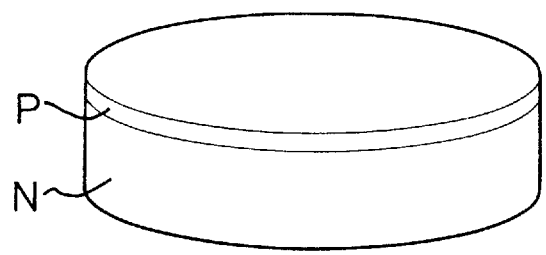
FIGS. 3A to 3D are diagrams showing the steps of the method in accordance with the invention for forming a diode chip comprising an N-type substrate and two P-type regions.
Figure 3B:
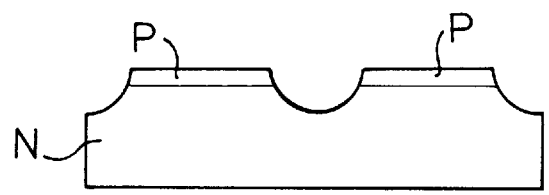
Figure 3C:
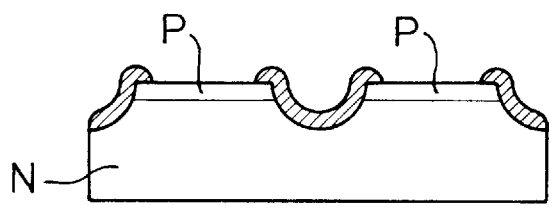
Figure 3D:
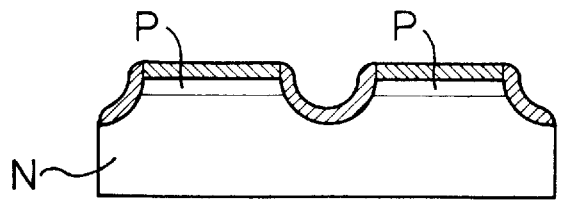

FIGS. 3A to 3D show the steps of the method in accordance with the invention for forming a diode chip comprising an N-type substrate and two P-type regions. The steps comprise:

(a1) Diffusing an N-type silicon wafer at a high temperature to produce a P-N junction, as shown in FIG. 3A;

(a2) Exposing the P-N junction through lithography and etching processes so as to form a silicon diode chip configuration having an N-type substrate and two P-type regions formed on the N-type substrate, as shown in FIG. 3B;

(a3) Passivating the etched areas by glass or silicide, as shown in FIG. 3C in dashed line; and (a4) Metallizing the surface electrodes of the silicon diode chip configuration, as shown in FIG. 3D in dark line.

The diode chip configuration is then cut to produce individual diode chips each having an N-type substrate and two P-type regions.

Likewise, individual diode chips each having a P-type substrate and two N-type regions can be produced by processing a P-type silicon wafer through the steps of diffusion, masking and etching, passivation, metallization and cutting. The two kinds of diode chips have substantially the same size.

Figure 4A:
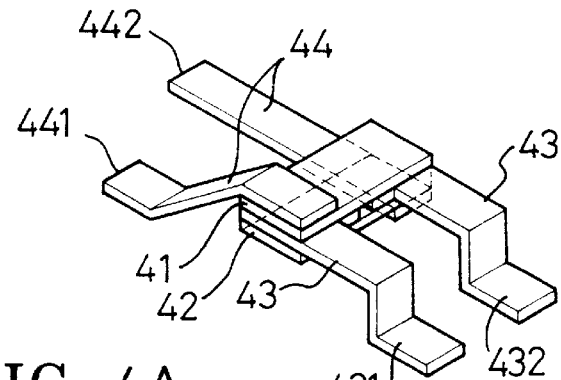
FIGS. 4A to 4C are diagrams respectively showing the structure, schematic circuit arrangement and package of the micro semiconductor bridge rectifier in accordance with the invention.
Figure 4B:
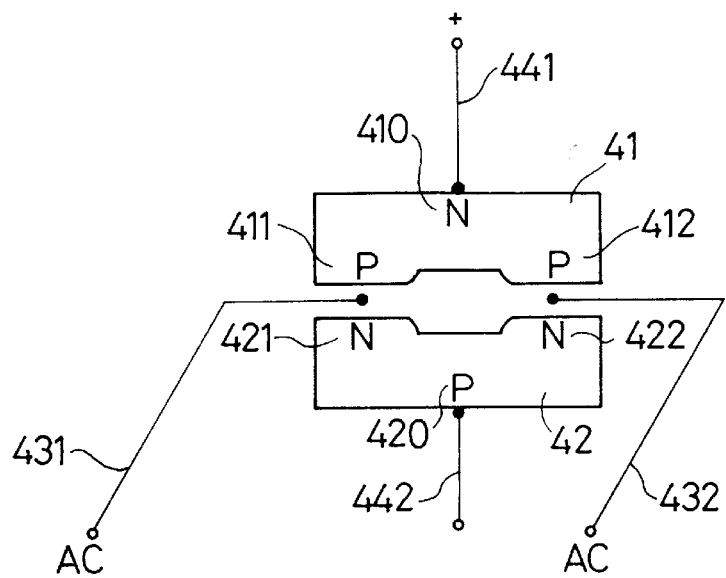
Figure 4C:
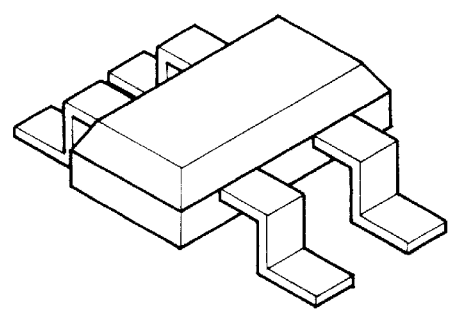

Referring now to FIGS. 4A and 4B, the first diode chip (41), i.e. the diode chip that has an N-type substrate and two P-type regions, and the second diode chip (42), i.e. the diode chip that has a P-type substrate and two N-type regions, are connected to the two electrodes (431, 432) of a first lead frame (43) by using soldering tools and solder (comprising tin and lead). In other words, one P-type region (411) of the first diode chip (41) and one N-type region (421) of the second diode chip (42) are connected to one electrode (431) of the first lead frame (43). The other P-type region (412) of the first diode chip (41) and the other N-type region (422) of the second diode chip (42) are connected to the other electrode (432) of the first lead frame (43). The N-type substrate (410) of the first diode chip (41) and the P-type substrate (420) of the second diode chip (42) are connected to respective electrodes (441, 442) of a second lead frame (44). The soldering process comprises the step of baking the first and second diode chips in order to melt the solder and weld the diode chips. The bridge rectifier is subsequently packaged with the lead frames sheared and bent to form the micro semiconductor bridge rectifier of the invention, as shown in FIG. 4C.

It should be understood that various other modifications will also be readily apparent to those skilled in the art without departing from the scope and spirit of the invention. Accordingly, it is not intended that the scope of the claims appended hereto be limited to the description set forth herein, but rather that the claims be construed as encompassing all the features of the patentable novelty that reside in the present invention, including all features that would be treated as equivalents thereof by those skilled in the art to which this invention pertains.

I claim:

1. A method of manufacturing a micro semiconductor bridge rectifier, comprising the steps of:

(a) forming a first diode chip comprising an N-type substrate and two P-type regions formed on the N-type substrate;

(b) forming a second diode chip comprising a P-type substrate and two N-type regions formed on the P-type substrate;

(c) connecting one P-type region of the first diode chip and one N-type region of the second diode chip to one electrode of a first lead frame, and connecting the other P-type region of the first diode chip and the other N-type region of the second diode chip to the other electrode of the first lead frame; and (d) connecting the N-type region of the first diode chip and the P-type region of the second diode chip to electrodes of a second lead frame respectively.

2. The method in accordance with claim 1, in which the step (a) comprises:

(a1) diffusing an N-type wafer to form a P-N junction;

(a2) using masking and etching techniques to expose the P-N junction so as to form the first diode chip;

(a3) passivating the etched regions; and (a4) metallizing the N-type and P-type regions.

3. The method in accordance with claim 1, in which the step (b) comprises:

(a1) diffusing a P-type wafer to form a P-N junction;

(a2) using masking and etching techniques to expose the P-N junction so as to form the second diode chip;

(a3) passivating the etched regions; and (a4) metallizing the N-type and P-type regions.

4. A micro semiconductor bridge rectifier comprising:

a first diode chip comprising an N-type substrate and two P-type regions formed on the N-type substrate; and a second diode chip comprising a P-type substrate and two N-type regions formed on the P-type substrate;

in which one P-type region of the first diode chip and one N-type region of the second diode chip are connected to one electrode of a first lead frame, and the other P-type region of the first diode chip and the other N-type region of the second diode chip are connected to the other electrode of the first lead frame; and the N-type region of the first diode chip and the P-type region of the second diode chip are connected to electrodes of a second lead frame respectively, thereby forming the micro semiconductor bridge rectifier.

5. The micro semiconductor bridge rectifier in accordance with claim 4, in which the first diode chip is formed by the following step:

(a1) diffusing an N-type wafer to form a P-N junction;

(a2) using masking and etching techniques to expose the P-N junction so as to form the first diode chip;

(a3) passivating the etched regions; and (a4) metallizing the N-type and P-type regions.

6. The micro semiconductor bridge rectifier in accordance with claim 4, in which the second diode chip is formed by the following steps:

(a1) diffusing a P-type wafer to form a P-N junction;

(a2) using masking and etching techniques to expose the P-N junction so as to form the second diode chip;

(a3) passivating the etched regions; and (a4) metallizing the N-type and P-type regions.

* * * * *